United States Patent [19]

Hupé

[11] 4,151,429
[45] Apr. 24, 1979

[54] DIFFERENTIAL CHARGE SENSING CIRCUIT FOR MOS DEVICES

[75] Inventor: Gerard J. Hupé, Ottawa, Canada

[73] Assignee: Northern Telecom Limited, Montreal, Canada

[21] Appl. No.: 838,892

[22] Filed: Oct. 3, 1977

[51] Int. Cl.² .................. H03K 5/20; H03K 5/159; G11C 19/28; G11C 19/18

[52] U.S. Cl. .................. 307/355; 307/200 B; 307/221 D; 307/DIG. 3; 328/151; 328/165; 333/165

[58] Field of Search .............. 307/200 B, 221 D, 304, 307/352, 353, 355, 356, DIG. 3; 328/146, 148, 149, 151, 156, 157, 165; 333/70 T

[56] References Cited

U.S. PATENT DOCUMENTS

| | | | |
|---|---|---|---|
| 3,781,574 | 12/1973 | White et al. | 328/165 X |
| 3,969,636 | 7/1976 | Baertsch et al. | 307/356 |
| 3,973,138 | 8/1976 | Puckette et al. | 307/221 D |
| 3,983,408 | 9/1976 | Adam et al. | 307/221 D |
| 4,004,157 | 1/1977 | Baertsch et al. | 307/355 X |
| 4,034,199 | 7/1977 | Lampe et al. | 307/221 D X |
| 4,041,298 | 8/1977 | Lampe et al. | 307/221 D X |
| 4,075,514 | 2/1978 | Sequin | 307/355 |

FOREIGN PATENT DOCUMENTS 2315799 1/1977 France ............... 307/221 D

OTHER PUBLICATIONS

Baertsch et al., *IEEE Trans. on Electron Devices*, vol ED-23, No. 2, pp. 133-141; 2/1976.

*Primary Examiner*—Larry N. Anagnos
*Attorney, Agent, or Firm*—Robert C. Hogeboom

[57] ABSTRACT

A non-destructive sensing of mobile charge in charge transfer devices or other MOS devices is accomplished by the use of a circuit utilizing two operational amplifiers. One operational amplifier is employed as an inverting amplifier responsive to one input signal, and the other operational amplifier is employed as a summing amplifier responsive both to a second input signal and to the output signal from the first operational amplifier. The electrodes of the MOS device being sensed, as well as capacitors in the sensing circuit, are precharged to given voltage levels before the actual sensing occurs.

10 Claims, 3 Drawing Figures

DIFFERENTIAL CHARGE SENSING CIRCUIT FOR MOS DEVICES

This invention relates to the sensing of signals in charge transfer devices (CTDs) or other MOS devices, and more particularly to a circuit for performing a nondestructive differential sensing of mobile charge in MOS devices.

Many techniques have been proposed for clocking, charge insertion and signal recovery in charge transfer devices. Some of the problem areas include signal-to-noise ratios, linearity, and the complexities of the circuitry involved. When differential sensing is employed with CTDs (for example, with transversal filters) additional problems arise. First, the desired output voltage signal is small. It is derived by subtracting the output signals from the two split-electrode portions, and each of these is normally much larger than the difference. Thus, even though the sense electrode output voltages may be large, the dynamic range of the actual output signal may be quite small in comparison. Signal-to-noise and dynamic range considerations are, therefore, more significant in transversal filters than in other types of CTDs (such as simple delay lines).

A second problem is that an uncorrectable error is introduced if the depletion capacitances of the storage electrodes depend on the electrode output voltages. This error arises because the depletion capacitance is a function of both the charge in the individual packet and the potential of the overlying sense electrode. This error is referred to as "crosstalk". One prior art solution to this problem has been to clamp the electrodes of the filter at a fixed voltage via operational amplifiers. This solution eliminates the "crosstalk" between the charge samples, but imposes severe requirements on the amplifiers. First, since uncorrelated amplifier noise is introduced before any subtraction takes place, the amplifier must have low noise; and second, the amplifier must handle the full dynamic range of the electrode signal, rather than just that of the difference signal. In the prior art, the problems associated with clamping the electrodes at a given voltage level have been worse than the "crosstalk" problem they were to solve. An article entitled "The Design and Operation of Practical Charge-Transfer Transversal Filters" by Richard D. Baertsch et al. in *IEEE Transactions on Electron Devices, Vol. ED*-23, No. 2, Feb. 1976, pg. 133–141 describes the problems associated with clamping the electrodes at a given voltage level, and describes alternative circuits for use with CTDs that do not clamp the electrodes, thereby avoiding the problems associated with clamping.

The present invention provides a circuit which clamps the electrodes at a given voltage level, thereby eliminating "crosstalk", but without the attendant disadvantages found in the prior art circuits.

The present invention employs a first inverting operational amplifier to sense the signal on a first electrode of a CTD. The resultant output signal from this first operational amplifier, as well as the signal from the second electrode, is applied to a second operational amplifier operated in a summing mode. The sense electrodes (of the CTD) as well as the positive and negative inputs of the two amplifiers, and the feedback capacitors of each amplifier are precharged to predetermined voltage levels. These elements are left floating at their precharged potential and the operational amplifier outputs are then connected to their respective feedback capacitors. The circuit is now in a state to sense the charge difference that will be transferred under the positive and negative electrode segments.

Stated in other terms, the present invention is a circuit for sensing the difference in charge between a first output electrode and a second output electrode of an MOS device, the circuit comprising: an inverting amplifier responsive to the charge on the first output electrode of the MOS device; a summing amplifier responsive both to the charge appearing on the second output electrode of the MOS device and to the output signal from the inverting amplifier; means for precharging the first electrode and the second electrode to a first predetermined DC voltage level; means for precharging the feedback capacitor of the inverting amplifier and the interconnection capacitor between the two amplifiers to a second predetermined DC voltage level; means for precharging the feedback capacitor of the summing amplifier to a third predetermined DC voltage level; means for selectively switching the feedback capacitors of the two amplifiers into, and out of, their respective feedback circuits; and means for selectively grounding the first output electrode and the second output electrode.

The invention will now be described in more detail with reference to the accompanying drawings in which.

Figure 1:
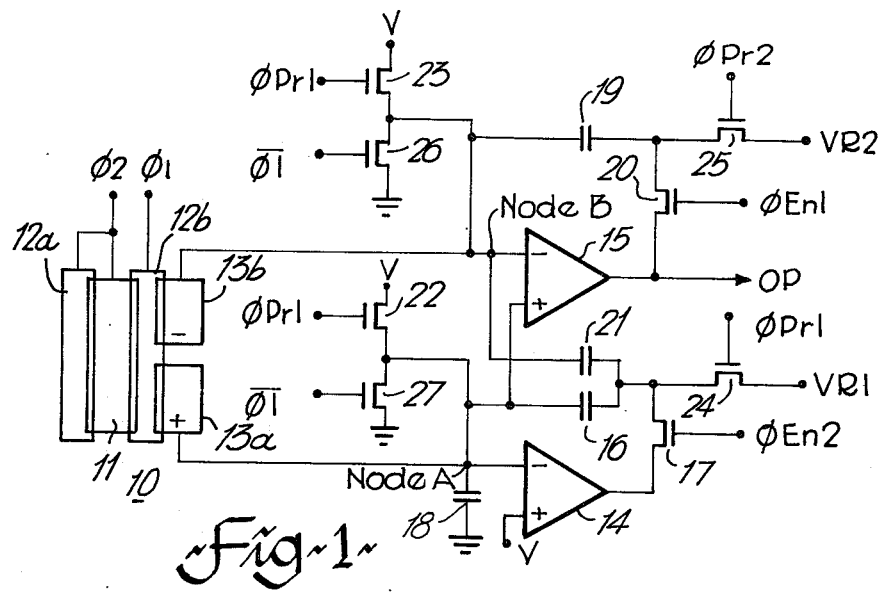
FIG. 1 is a simplified schematic diagram of one embodiment of the present invention, shown connected to a transversal filter.

As stated previously, FIG. 1 shows the present invention applied to a transversal filter 10, depicted schematically in the Figure. Filter 10 of the Figure is shown in a simplified form and comprises a storage electrode 11, transfer electrodes 12a and 12b, a positive sense electrode 13a, and a negative sense electrode 13b. The inverting input of operational amplifier 14 is connected to positive sense electrode 13a, and the inverting input of operational amplifier 15 is connected to negative sense electrode 13b.

Figure 2:
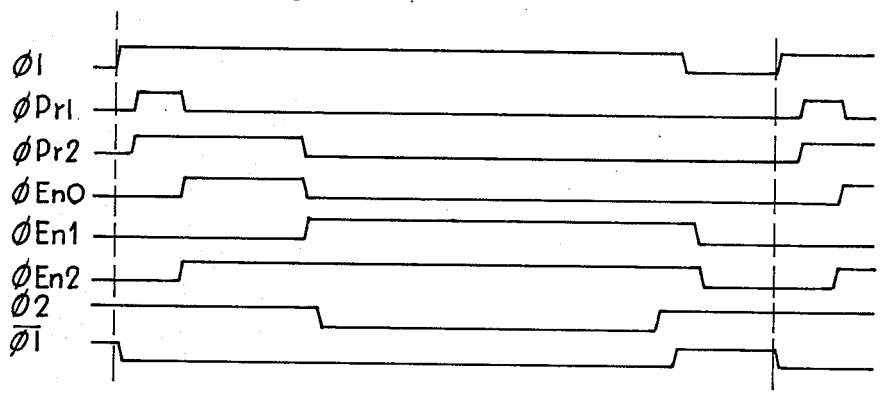
FIG. 2 depicts waveforms useful for understanding the operation of the circuits depicted in FIGS. 1 and 3.

The simplified structure of the circuit is depicted in FIG. 1 and attention is directed to it. The operation of the FIG. 1 circuit and some of the basics underlying its operation will now be discussed with reference to the waveforms contained in FIG. 2. It should be noted that if FIG. 1 were to be described in isolation (i.e. without FIG. 3) the number of waveforms employed could be reduced. However, both in order to be consistent between FIGS. 1 and 3, and to simplify the description of the invention, a common set of waveforms for both FIGS. 1 and 3 has been used.

Operational amplifier 14, feedback capacitor 16, and field effect transistor (FET) 17 form an inverting amplifier responsive to the signal on electrode 13a. Since electrode 13a exhibits a capacitive effect, the feedback element associated with amplifier 14 (i.e. capacitor 16) must likewise have a capacitive effect. Capacitor 18 is employed to optimize the noise rejection in the power supply providing the positive voltage V, as well as to reduce the noise voltage and offset voltage of amplifier 14. Capacitor 18 will be described in more detail later.

Operational amplifier 15, feedback capacitor 19, and FET 20 form an inverting amplifier responsive both to the signal on electrode 13b and, to the signal received from the output of amplifier 14 via capacitor 21 and FET 17. In effect, amplifier 15 functions as a "summing amplifier" summing the two signals appearing at its inverting input. Consequently, the output signal OP, from amplifier 15, is the difference between the signals appearing on electrodes 13a and 13b, discounting any gain in the amplifier circuits.

Of course, when employing capacitive elements in an amplifier circuit, the operation of the amplifiers is not quite that simple. Attention is directed to both FIGS. 1 and 2 so that the detailed switching operation of the amplifier circuits can be described.

During the time that clock signal $\phi$Pr1 is high, field effect transistors 22 and 23 are in the conducting mode, and precharge the sense electrodes 13a and 13b as well as one plate of each of capacitors 16, 18, 19 and 21 to V potential. Additionally, field effect transistor 24 is turned on and precharges the second plate of each of capacitors 16 and 21 to a potential of VR1. Field effect transistor 25 is turned on when $\phi$Pr2 is high and precharges the second plate of capacitor 19 to a potential of VR2. The second plate of capacitor 18 is connected directly to ground potential. When clock signals $\phi$Pr1 and $\phi$Pr2 go to a low level, the sense electrodes 13a and 13b, as well as capacitors 16, 18, 19 and 21 are left floating at their precharge voltage levels.

When clock signals $\phi$En2 and $\phi$En1 go high, FETs 17 and 20 respectively are turned on and connect capacitors 16, 19 and 21 to their respective operational amplifiers. This closes the feedback loop of each amplifier 14 and 15, which enables each amplifier 14 and 15 to maintain on nodes A and B, respectively, the potential applied to their non-inverting (+) input (i.e. voltage V). By maintaining V potential on nodes A and B, the VR1 potential will be retained on the second plate of each of capacitors 16 and 21 (i.e. that plate connected to FET 24) and VR2 will be retained on the second plate of capacitor 19 (i.e. that plate connected to FET 25).

At the falling edge of the $\phi$2 signal (i.e. when $\phi$2 goes low) the mobile charge under the storage electrode 11 of filter 10 will be transferred to the sense electrodes 13a and 13b, and split into charge Q+ on electrode 13a and charge Q− on electrode 13b. This charge (i.e. Q+ and Q−) will cause a negative voltage transient at nodes A and B. Consequently, the output voltage signal from amplifier 14 will charge in a positive direction from the voltage level VR1 to cause a charge equal to Q+ to flow out of capacitor 16. This process is necessary to re-establish the potential V at node A. In designs where the values of capacitors 16 and 21 are equal, an equal amount of charge will flow out of capacitor 21 into node B, once the latter is at the potential V. Operational amplifier 15 will re-establish a potential of V to node B by adding to it, or removing from it, a charge equal to the difference between the charges Q+ and Q−. This will result in the output signal OP of amplifier 15 changing from a voltage VR2 by a voltage equal to the charge difference between the sense electrodes 13a and 13b scaled by the capacitance value of capacitor 19.

Capacitor 18 is employed to optimize the circuit for noise rejection and to reduce the voltage offset of amplifier 14 as stated previously. The values of the capacitors are chosen both so that the capacitance value between node A and ground is equal to the capacitance value between node B and ground, and so that there will be symmetry in the circuit. The capacitance of sense electrode 13a is equal to the capacitance of sense electrode 13b (by design of filter 10). Capacitor 16 is made equal in value to capacitor 21 (for symmetry), and consequently capacitor 18 must be equal in value to capacitor 19 to meet the above stated criterion in equal capacitance values connected to nodes A and B. Clock signal $\phi$1 is applied to transfer electrode 12b of transversal filter 10 to provide for proper operation of filter 10. Clock signal $\overline{\phi1}$, which is 180° out of phase with signal $\phi$1, causes FET 26 to turn on (when signal $\overline{\phi1}$ goes high) and thus cause a ground potential to be applied to node B. Similarly, when $\overline{\phi1}$ goes high, FET 27 turns on and applies ground potential to node A. Applying ground potential to nodes A and B in this manner is necessary to transfer the charge out of sense electrodes 13a and 13b. From FIG. 2 it can be readily seen that when $\overline{\phi1}$ is high and FETs 26 and 27 are therefore turned on, $\phi$Pr1 is low and consequently FETs 22 and 23 are turned off. It should also be noted that the required output signal is present on the output of operational amplifier 15 (i.e. signal OP) only during the time period that signal $\phi$2 is low.

Sample values for the circuit of FIG. 1, applied to a 70 sense electrode transversal filter are as follows:
 Capacitor 16=Capacitor 21=20 pF
 Capacitor 18=Capacitor 19=5 pF
 Frequency of signal $\phi$Pr1=32 KHz
 Operational amplifiers 14 and 15 have high input impedance (e.g. MOS construction)
 V>VR2>VR1 (noted: VR1≃Ground voltage)

Figure 3:
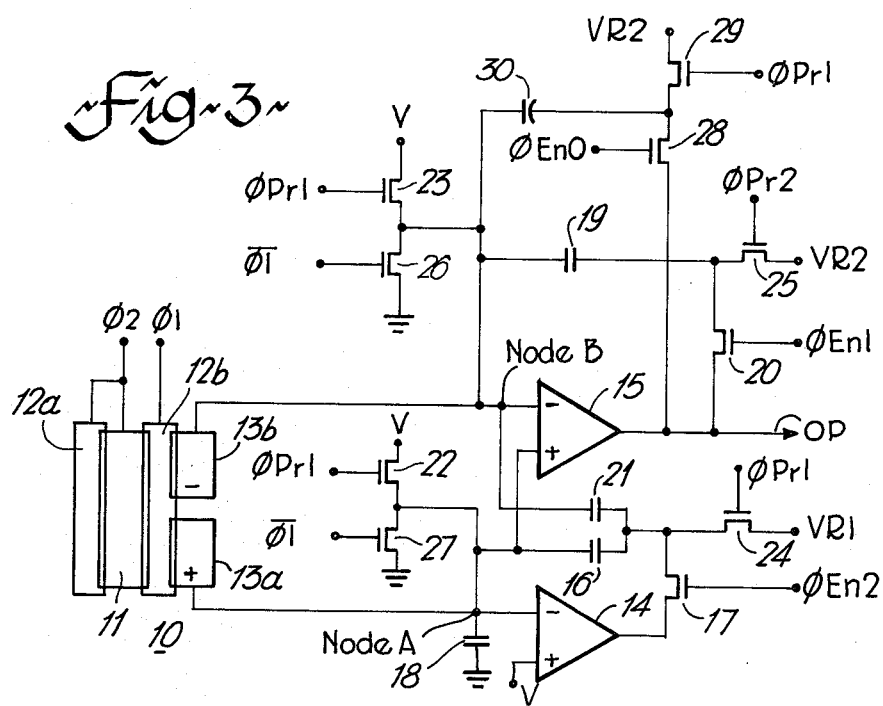
FIG. 3 is a simplified schematic diagram of a second and preferred embodiment of the present invention.

FIG. 3 depicts a simplified schematic of the preferred embodiment of the invention. It will be noted that FIG. 3 is identical to FIG. 1 except for the addition of three extra components namely: FET 28, FET 29 and capacitor 30. The circuit of FIG. 3 functions in a similar fashion to the circuit of FIG. 1, so its operation will not be discussed in detail; only the difference of FIG. 3 will be described. The components of the preferred embodiment are interconnected as shown in FIG. 3, and attention is directed to that Figure. The effect of FET 28, FET 29, and capacitor 30 is to reduce the offset voltage of amplifier 15 and to attenuate the 1/f portion of the noise spectrum of amplifier 15 (where f is the frequency of the noise). The remainder of the circuit functions in the same manner as does the circuit of FIG. 1, and includes the same advantages as does the FIG. 1 circuit. Capacitor 30 has a value of approximately 1.5 pF. Capacitor 30 does not affect the capacitive balance between nodes A and B (mentioned earlier in reference to FIG. 1) since capacitor 30 does not form a part of the active circuit during the period that the desired output is present on the output of amplifier 15. As was mentioned previously, the desired output signal is present at the output of amplifier 15 only during the time period that signal $\phi$2 is low. Capacitor 30, of course, is only an active component of the circuit during the time periods that $\phi$Pr1 and $\phi$En0 are high.

What is claimed is:

1. A circuit for sensing the difference in charge between a first output electrode and a second output electrode of an MOS device, said circuit comprising:
 an inverting amplifier, including a feedback capacitor, responsive to the charge on said first output electrode of said MOS device;
 a summing amplifier, including a feedback capacitor, responsive both to the charge appearing on said second output electrode of said MOS device and to the output signal from said inverting amplifier, via an interconnection capacitor;

means for precharging said first electrode and said second electrode to a first predetermined DC voltage level;

means for precharging the feedback capacitor of said inverting amplifier and the interconnection capacitor between the two amplifiers to a second predetermined DC voltage level;

means for precharging the feedback capacitor of said summing amplifier to a third predetermined DC voltage level;

means for selectively switching said feedback capacitors of the two amplifiers into, and out of, their respective feedback circuits; and means for selectively grounding said first output electrode and said second output electrode.

2. The circuit of claim 1 further including a generating means for supplying the required clock signals for controlling all said means for precharging, said means for selectively switching, and said means for selectively grounding.

3. The circuit of claim 2 wherein said MOS device is a charge transfer device.

4. The circuit of claim 2 wherein all said means for precharging, said means for selectively switching, and said means for selectively grounding, each comprise a field effect transistor.

5. The circuit of claim 1 wherein said MOS device is a charge transfer device.

6. The circuit of claim 1 wherein all said means for precharging, samd means for selectively switching, and said means for selectively grounding, each comprise a field effect transistor.

7. The circuit of claim 1 further including the combination of an additional capacitor (30) in series with a FET (28), said combination connected in parallel with the feedback loop (19,20) of said summing amplifier (15), and means (23,29) for precharging said additional capacitor (30) to said third predetermined DC voltage level.

8. In a circuit comprising an inverting amplifier responsive to the signal on a first electrode, and a summing amplifier responsive both to the output signal from said inverting amplifier and to the signal on a second electrode, the method comprising:

precharging said first electrode and said second electrode to a first DC voltage level;

precharging the feedback capacitor of said inverting amplifier and the interconnection capacitor between the two amplifiers to a second DC voltage level;

precharging the feedback capacitor of said summing amplifier to a third DC voltage level;

selectively switching the feedback capacitors of the two amplifiers into, and out of, their respective feedback circuits; and selectively applying ground potential to said first electrode and to said second electrode.

9. The method of claim 8 wherein all said precharging steps begin essentially simultaneously; the step of switching the feedback capacitors into the circuit follows the precharging step; and the step of selectively applying ground potential to said first and second electrodes occurs during the final time period that said feedback capacitors are in their respective feedback circuits, and it continues once said feedback capacitors are switched out of their feedback circuits, but it stops before said precharging re-commences.

10. The method of claim 9 wherein clock signals are employed for controlling the timing of the steps of precharging, switching, and selectively applying ground potential.

* * * * *